US005376955A

United States Patent [19]

Okabe et al.

[11] Patent Number: 5,376,955

[45] Date of Patent: Dec. 27, 1994

[54] ELECTROSTATIC CHARGE INFORMATION REPRODUCING METHOD WITH CHARGE TRANSFER BY ELECTROSTATIC DISCHARGE

[75] Inventors: Masato Okabe; Masayuki Iijima; Takashi Aono, all of Tokyo, Japan

[73] Assignee: Dai Nippon Printing Co., Ltd., Tokyo, Japan

[21] Appl. No.: 741,504

[22] PCT Filed: Nov. 29, 1990

[86] PCT No.: PCT/JP90/01551

§ 371 Date: Jul. 29, 1991

§ 102(e) Date: Jul. 29, 1991

[87] PCT Pub. No.: WO91/08522

PCT Pub. Date: Jun. 13, 1991

[30] Foreign Application Priority Data

Nov. 29, 1989 [JP] Japan .................................. 1-311491

Nov. 29, 1989 [JP] Japan .................................. 1-311492

[51] Int. Cl.[5] ....................... G01D 15/06; G11C 13/04

[52] U.S. Cl. .................................. 346/153.1; 365/112

[58] Field of Search ............................ 346/1.1, 153.1; 365/112

[56] References Cited

U.S. PATENT DOCUMENTS 2,838,997 6/1958 Moncrieff-Yeates ............ 346/153.1
3,551,146 12/1970 Gundlach ......................... 346/153.1
3,703,376 11/1972 Gundlach et al. ............... 346/153.1
3,902,181 8/1975 Veith .............................. 346/153.1
4,410,614 10/1983 Lelental et al. ................. 346/153.1
4,458,258 7/1984 Amaya et al. .................... 346/153.1
4,568,955 2/1986 Hosoya et al. ................... 346/153.1
4,697,196 9/1987 Inaba et al. ......................... 346/159
5,055,936 10/1991 Takanashi et al. ................. 358/296
5,095,201 3/1992 Takanashi et al. ............. 358/300 X

*Primary Examiner*—Benjamin R. Fuller
*Assistant Examiner*—Randy W. Gibson
*Attorney, Agent, or Firm*—Dellett and Walters

[57] ABSTRACT

A master electric charge retaining medium 2 having electrostatic charge information recorded thereon is disposed face-to-face with a reproductive electric charge retaining medium 3, and a voltage is applied between the respective electrodes of the two electric charge retaining media to induce an electric discharge, thereby inversely reproducing the electrostatic charge information on the reproductive electric charge retaining medium, as shown in FIG. 2(*b*). It is possible to effect the reproduction any number of times while preventing the lowering in the contrast of the master electric charge retaining medium by making the electrostatic capacity of the master electric charge retaining medium adequately larger than the electrostatic capacity of the reproductive electric charge retaining medium. In addition, a master electric charge retaining medium 2 having an insulating layer with a relatively high softening point and a reproductive electric charge retaining medium 4 having a thermosoftening resin layer 4*a* are disposed face-to-face with each other to induce electric charge on the thermosoftening resin layer in correspondence to the electrostatic charge image on the master electric charge retaining medium 2, and the thermosoftening resin layer is softened by heating to form a dimple pattern thereon, thereby enabling transfer development to be effected any number of times without leaking the electrostatic charge.

5 Claims, 5 Drawing Sheets

ELECTROSTATIC CHARGE INFORMATION REPRODUCING METHOD WITH CHARGE TRANSFER BY ELECTROSTATIC DISCHARGE

TECHNICAL FIELD

The present invention relates to a method of reproducing (transferring) electrostatic charge information formed on an electric charge retaining medium on another electric charge retaining medium.

BACKGROUND ART

Transfer or reproduction of an electrostatic charge image is generally conducted in such a manner that a photoconductive layer, which is stacked on an electrode, is fully charged by corona charging in the dark and then exposed to intense light to thereby turn the exposed areas of the photoconductive layer electrically conductive, and the charge in the exposed areas is removed by leaking, thereby optically forming an electrostatic charge image on the surface of the photoconductive layer, and thereafter toner that has electric charge which is opposite in polarity to (or the same as) the residual charge is attached thereto, thereby developing the electrostatic charge image.

This electrophotographic technique cannot generally be used for photographing because of low sensitivity, and it is common practice to carry out toner development immediately after the formation of an electrostatic latent image because the electrostatic charge retaining time is short.

In the meantime, an image recording method by exposure under voltage application has been developed in which a photosensitive member that comprises a photoconductive layer stacked on an electrode is disposed face-to-face with an electric charge retaining medium that comprises an insulating layer stacked on an electrode, and in this state, image exposure is effected with a voltage being applied between the two electrodes, thereby recording an electrostatic charge image of extremely high resolution on the electric charge retaining medium and also enabling the electrostatic charge image retaining time to be lengthened extremely. To transfer such an electrostatic charge image by the toner development as in the conventional practice, image exposure must be effected for each transfer process and the operation is therefore troublesome. Since the electric charge retaining medium has an extremely long electric charge retaining time, the medium itself can be utilized as an information medium, and it has been demanded to enable the electrostatic charge information on the electric charge retaining medium to be directly transferred or reproduced.

There is another known developing method wherein a thermoplastic resin layer having an electrostatic charge image formed thereon is heated to form a dimple pattern image and then cooled to fix the image, thereby developing the electrostatic charge pattern.

According to this developing method, a photoconductive member 10, which comprises an electrode 10*b* and a thermoplastic resin layer 10*a* that are formed on a substrate 10*c*, is uniformly charged by corona charging with a charger 11, as shown exemplarily in FIG. 1(*a*). Then, image exposure is effected to form an electrostatic charge pattern in the shape of the image, as shown in FIG. 1(*b*). Thereafter, the photoconductive member is heated with a heater 12, with the electrode 10*b* grounded, as shown in FIG. 1(*c*). In consequence, the thermoplastic resin layer 10*a* is plasticized, and the electric surface charge and the electric charge of the opposite sign that is induced on the electrode 10*b* in correspondence to the electrostatic charge pattern attract each other. As a result, a dimple pattern image 10*a*, that is, a frost image, is formed on the surface of the thermoplastic resin layer, as shown in FIG. 1(*d*). After the formation of the frost image, the photoconductive member is cooled to fix the dimple pattern image, thus enabling development of the electrostatic charge pattern.

However, the conventional developing method shown in FIG. 1 is inferior in the electric charge retaining performance because the electrostatic latent image is formed on the photoconductive member. For this reason, a method has been proposed wherein an electrostatic charge pattern is formed on an electric charge retaining medium which has a thermoplastic resin layer of high insulation quality, to thereby form a frost image. With this method, however, it is impossible to transfer a particular electrostatic charge image many times because the electrostatic charge leaks each time a frost image is formed by heating.

It is an object of the present invention to enable electrostatic charge information formed on an electric charge retaining medium to be transferred to or reproduced on another electric charge retaining medium many times without performing toner development.

It is another object of the present invention to provide an electrostatic charge information reproducing method which enables an electric charge retaining medium to be even more utilized as an information medium.

DISCLOSURE OF THE INVENTION

The present invention is characterized in that a voltage is applied between a master electric charge retaining medium having electrostatic charge information recorded thereon and a reproductive electric charge retaining medium, which are disposed face-to-face with each other, to induce an electric discharge, thereby allowing the electrostatic charge information on the master electric charge retaining medium to be inversely reproduced on the reproductive electric charge retaining medium.

The present invention is also characterized in that an electric charge retaining medium having a thermosoftening resin layer, which is used as a reproductive electric charge retaining medium, is disposed face-to-face with an electric charge retaining medium having an insulating material layer whose softening point is higher than the heat distortion temperature of the thermosoftening resin layer, which is used as a master electric charge retaining medium having an electrostatic charge image formed thereon, and in this state, thermal development is effected to thereby form a frost image on the thermosoftening resin layer reproductively.

BEST MODE FOR CARRYING OUT THE INVENTION

Figure 1:
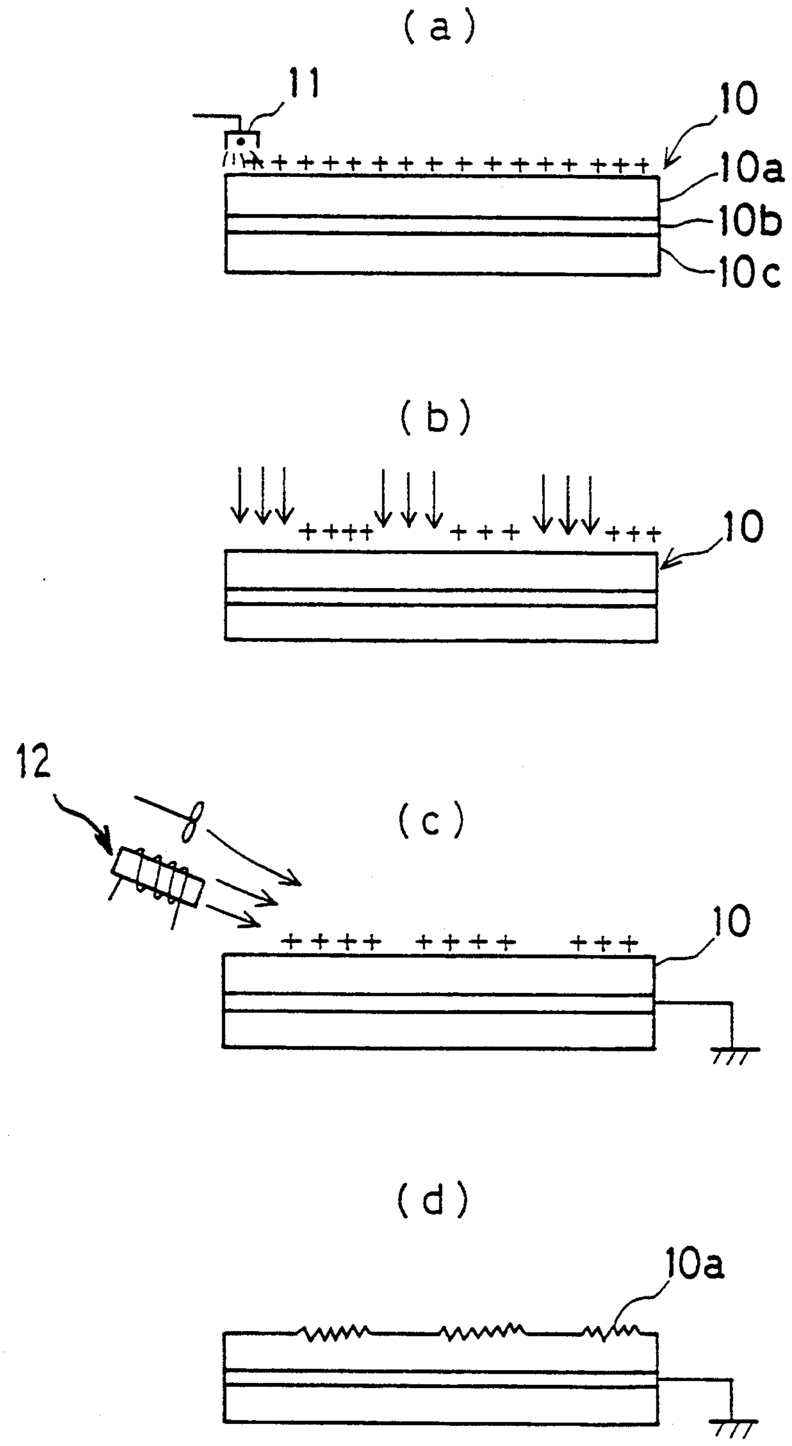
(PRIOR ART) FIG. 1
FIG. 1 is a view for explanation of a conventional method of forming a frost image.
Figure 2A:
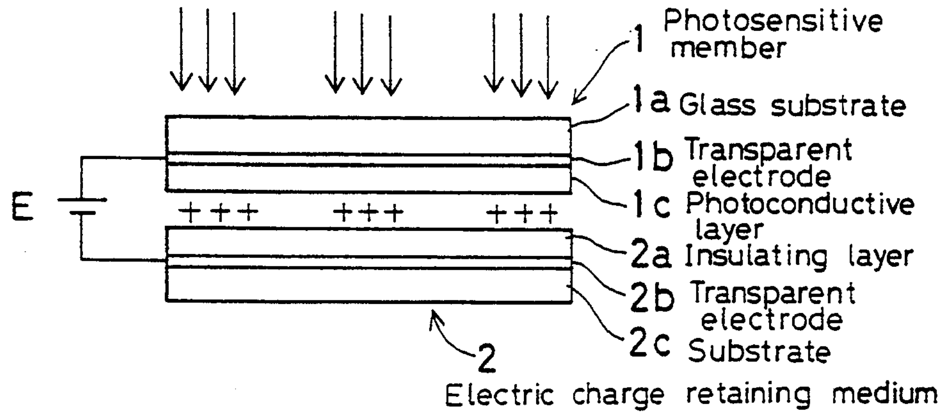
FIGS. 2(*a*) and 2(*b*) are views for explanation of the image exposure method and reproducing method of the present invention.
Figure 2B:
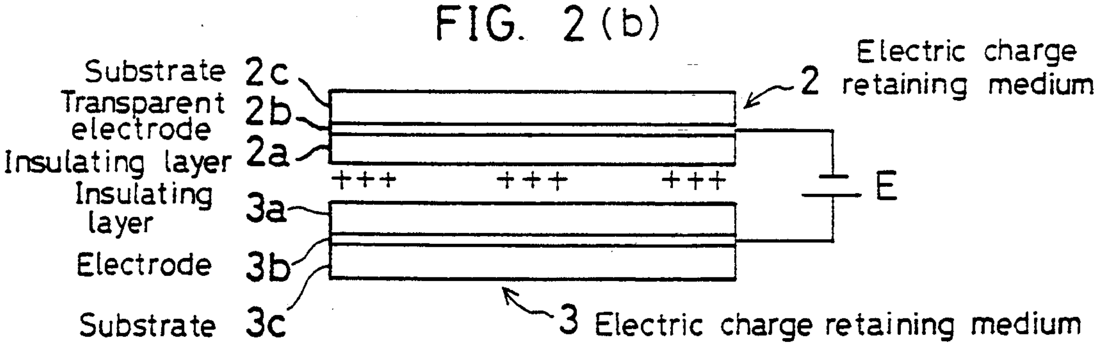
Figure 3:
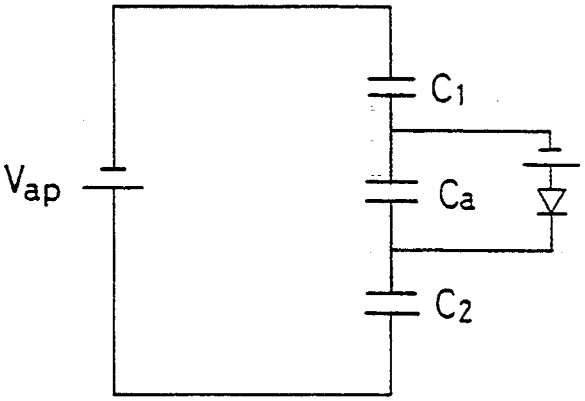
FIG. 3 is a diagram showing an equivalent circuit.

FIGS. 2(*a*) and 2(*b*) are views for explanation of one embodiment of the image exposure method and reproducing method according to the present invention, and FIG. 3 is a diagram showing an equivalent circuit. In these figures, reference numeral 1 denotes a photosensitive member, 1*a* a glass substrate, 1*b* a transparent electrode, 1*c* a photoconductive layer, 2 a master electric charge retaining medium, 2*a* an insulating layer, 2*b* a transparent electrode, 2*c* a substrate, E a power supply, 3 a reproductive electric charge retaining medium, 3*a* an insulating layer, 3*b* an electrode, and 3*c* a substrate.

Referring to FIG. 2(*a*), the photosensitive member 1 comprises the glass substrate la having a thickness of about 1 mm, the transparent electrode 1*b* formed thereon with a thickness of 1000 Å from ITO, and the photoconductive layer formed thereon with a thickness of about 10 μm, wherein areas that are exposed to light become electrically conductive. The master electric charge retaining medium 2, which is disposed face-to-face with this photosensitive member across a gap of about 10 μm, comprises the transparent electrode 2*b* formed on the substrate 2*c* having a thickness of about 100 μm to 1000 μm, and the insulating layer 2*a* formed on the transparent electrode, with a thickness of 1 to 10 μm.

When image exposure is effected with a voltage being applied between the respective electrodes of the photosensitive member and the master electric charge retaining medium 2 disposed face-to-face with each other, the regions of the photosensitive member which are irradiated with light become electrically conductive, so that a high voltage is applied across the gap between the photosensitive member and the electric charge retaining medium, thus inducing an electric discharge. On the other hand, the regions of the photosensitive member which are not irradiated with light remain insulating. In these regions, therefore, no voltage that exceeds the discharge breakdown voltage is applied across the gap between the photosensitive member and the electric charge retaining medium and hence no electric discharge occurs. As a result, electrostatic charge pattern information corresponding to the image is formed on the insulating layer 2*a*.

Next, the electric charge retaining medium 2 formed with the electrostatic charge information, which is defined as a master, is disposed face-to-face with the reproductive electric charge retaining medium 3 which is similar in arrangement to the master, as shown in FIG. 2(*b*), and a predetermined voltage is applied between the two electrodes 2*b* and 3*b* from the power supply E. This state may be expressed in the form of an equivalent circuit such as that shown in FIG. 3.

In FIG. 3, C1 denotes the electrostatic capacity of the master electric charge retaining medium, C2 the electrostatic capacity of the reproductive electric charge retaining medium, Ca the electrostatic capacity of the gap, and Vap the power supply voltage. Assuming that Va denotes the discharge breakdown voltage at the gap, V0 the potential measured when the electric charge is formed on the master electric charge retaining medium by exposure under voltage application in FIG. 2(*a*), V1' the potential of the master electric charge retaining medium that results from the electric discharge reproduction in FIG. 2(*b*), and V2' the potential of the reproductive electric charge retaining medium that results from the electric discharge reproduction, since the electric charge that is supplied to the master electric charge retaining medium from the power supply by the electric discharge is equal to the quantity of electric charge stored in the gap and on the reproductive electric charge retaining medium, the following equations hold for each of the opposing regions of the two electric charge retaining media:

$$V1' + Va + V2' = Vap \tag{1}$$

$$C1V1' - C2V2' = C1V0 \tag{2}$$

Equations (1) and (2) are solved as follows:

$$V1' = \frac{C1}{C1 + C2} V0 + \frac{C2}{C1 + C2} (Vap - Va) \tag{3}$$

$$V2' = -\frac{C1}{C1 + C2} V0 + \frac{C1}{C1 + C2} (Vap - Va) \tag{4}$$

In addition, the air layer is charged at the upper and lower sides thereof as follows:

$$\pm Qa = \pm CaVa$$

The two electric charge retaining media are charged respectively as follows:

$$Q1' = C1V1'$$

$$Q2' = C2V2'$$

when the two electric charge retaining media are separated from each other, the positive and negative charges stored on the air layer are attracted to the respective electric charge retaining media which are closer thereto. As a result, the two electric charge retaining media are charged as follows:

$$Q1 = Q1' - Qa = C1V1' - CaVa$$

$$Q2 = Q2' + jQa = -C2V2' + CaVa$$

At this time, the potentials V1 and V2 of the electric charge retaining media 2 and 3 are given by $$V1 = \frac{C1}{C1 + C2} V0 + \frac{C1}{C1 + C2} (Vap - Va) - \frac{CaVa}{C1} \tag{5}$$

$$V2 = -\frac{C1}{C1 + C2} V0 + \frac{C1}{C1 + C2} (Vap - Va) - \frac{CaVa}{C1} \tag{6}$$

Figure 4:
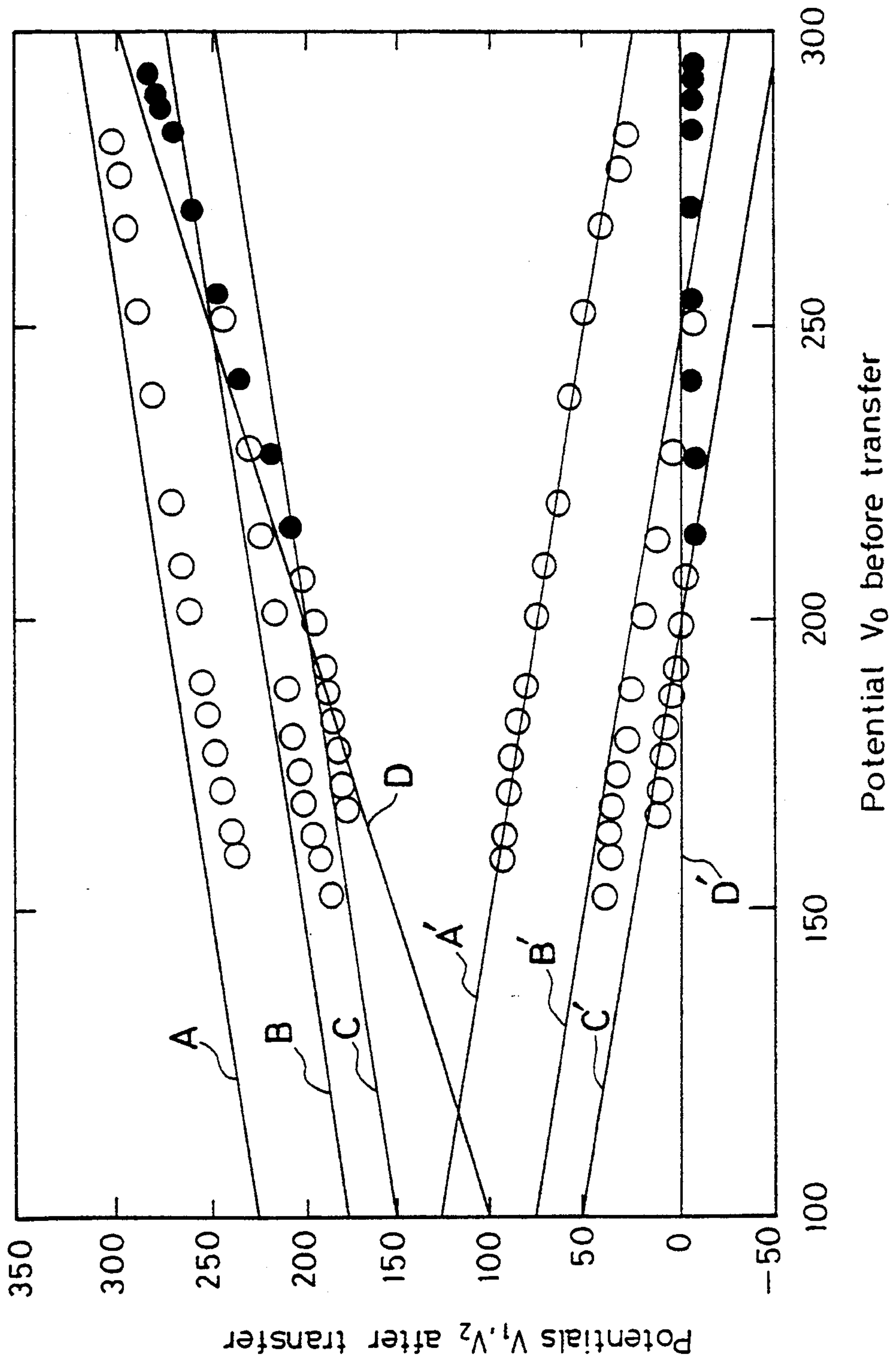
FIG. 4 is a graph showing the relationship between the potential before transfer and the potential after transfer.

FIG. 4 is a graph showing the relationship between the potential of the master electric charge retaining medium before the transfer and the potentials V1 and V2 of the two electric charge retaining media after the transfer.

In FIG. 4, the straight lines that extend upward to the right are graphic representation of equation (5), while the straight lines that extend downward to the right are graphic representation of equation (6), in which: A and A′ are obtained when Vap=800V; B and B′ when Vap=700V; C and C′ when Vap=650V; D and D′ when no electric discharge occurs; and ○ and ● express experimental values corresponding to each straight line (○ is equivalent to a case where an electric discharge occurred, whereas ● is equivalent to a case where no electric discharge occurred).

A region of the reproductive electric charge retaining medium which faces a high-potential region of the master electric charge retaining medium has a low potential, whereas a region of the reproductive electric charge retaining medium which faces a low-potential region of the master electric charge retaining medium has a high potential. Accordingly, a negative image of the electrostatic charge image on the master electric charge retaining medium is reproduced on the reproductive electric charge retaining medium.

Figure 5:
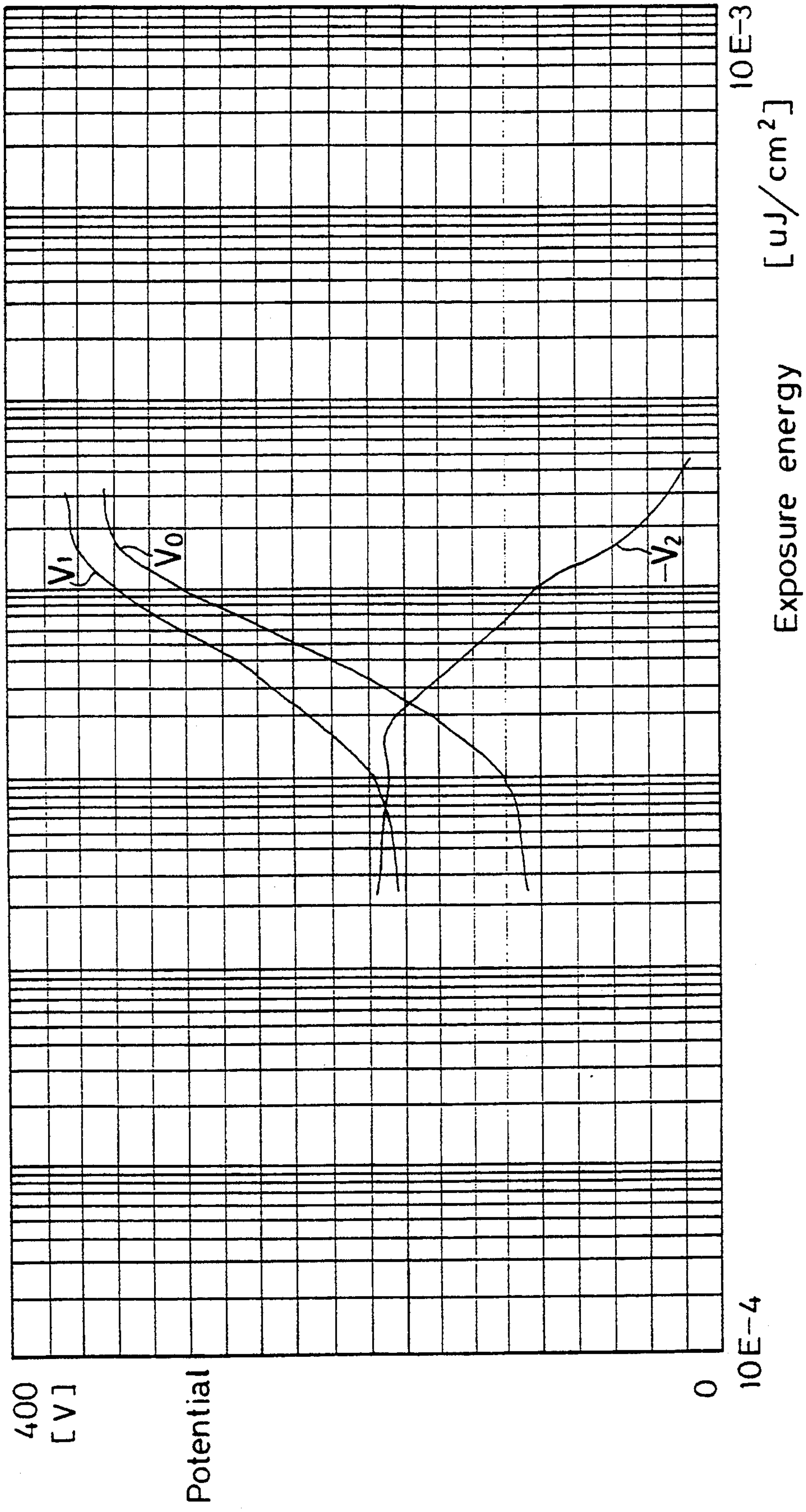
FIG. 5 is a graph showing the relationship between the exposure energy on the one hand and, on the other, the potential before transfer and the potential after transfer.

FIG. 5 shows the relationship between the exposure energy on the one hand and, on the other, the potential V0 of the master electric charge retaining medium and the potentials V1 and V2 of the two electric charge retaining media after the transfer. It should be noted that in the figure V2 is expressed in absolute value with the polarity changed.

FIG. 5 shows that the difference between the maximum value and the minimum value of the curve representing the potential V1 after the transfer, i.e., the contrast of the master electric charge retaining medium, is smaller than the difference between the maximum value and the minimum value of the curve representing the potential V0 before the transfer and that the image undesirably changes in the process of repetition of reproduction. The rate of change is C1/(C1+C2), as will be understood from equation (3). Therefore, the degree of lowering in the contrast can be minimized by making C1 larger than C2, and the lowering of the contrast can be substantially prevented by making C1 adequately larger than C2. In consequence, it becomes possible to effect reproduction many times. It is an effective way of increasing C1 to reduce the film thickness of the master electric charge retaining medium or use an inorganic master electric charge retaining medium with a large specific dielectric constant.

Examples of the method shown in FIG. 2 will next be explained.

EXAMPLE 1

A 7 wt % fluorine solution (manufactured by Asahi Glass Company, Ltd.) of fluorocarbon resin (Cytop, trade name, manufactured by Asahi Glass Company, Ltd.) was coated on a glass substrate having an ITO electrode evaporated thereon by use of a spin coater at 1500 rpm and then dried for about 1 hour at 150° C. to obtain a thin Cytop film of 2.6 μm thick.

EXAMPLE 2

The medium obtained in Example 1 and an organic photoconductive material stacked on a transparent electrode were disposed face-to-face with each other across an air gap defined by a spacer comprising a polyester film of 9 μm. Next, image exposure was effected by projecting an image from the transparent electrode side of the photoconductive material under the application of 700 V for 0.1 sec between the two electrodes, thereby forming an electrostatic latent image on the medium. Thereafter, the medium I formed with the electrostatic latent image was disposed face-to-face with another medium II shown in Example 1 across an air gap defined by a spacer comprising a polyester film of 9 μm. In this state, a voltage of 800 V was applied between the two electrodes to induce an electric discharge, so that it was possible to form of an electrostatic latent image on the medium II, which was inversely copied from the electrostatic latent image on the medium I.

Thus, by inducing an electric discharge between the master electric charge retaining medium and the reproductive electric charge retaining medium, which are disposed face-to-face with each other, electrostatic charge information can be inversely reproduced on the reproductive electric charge retaining medium. At this time, it is possible to effect reproduction any number of times while preventing the lowering in the contrast of the master electric charge retaining medium by making the electrostatic capacity of the master electric charge retaining medium adequately larger than the electrostatic capacity of the reproductive electric charge retaining medium. Accordingly, reproduction can be effected without the need for toner development as in the prior art, and it is possible to further improve the function of the electric charge retaining medium itself as an information medium.

Another embodiment of the electrostatic charge reproducing method will next be explained with reference to FIGS. 6 to 8.

Figure 6:
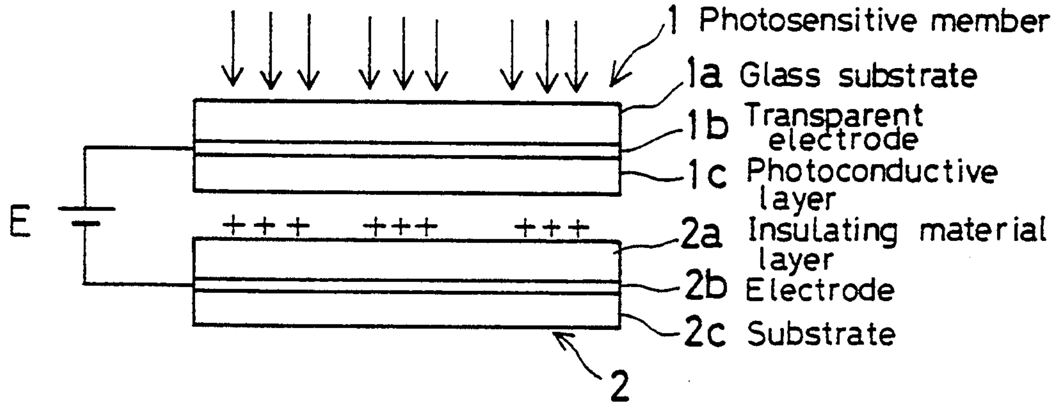
FIG. 6 is a view for explanation of a method of forming an electrostatic charge pattern.

FIG. 6 is a view for explanation of an electrostatic charge pattern forming method; FIG. 7 is a view for explanation of thermal development; and FIG. 8 is a view for explanation of a frost image formed. In the figures, the same reference numerals as those in FIG. 2 denote the same contents. Reference numeral 4 denotes an electric charge retaining medium, 4a a thermosoftening resin layer, 4b an electrode, 4c a substrate, 5 a heater, and 41 a frost image. It should be noted that the photosensitive member 1 and the electric charge retaining medium 2 are the same as in the case of FIG. 2(a) and the electric charge retaining medium 4 comprises the substrate 4c, e.g., a glass substrate, the electrode 4b formed thereon by evaporation, and the thermosoftening resin layer 4a, e.g., a rosin ester polymer, formed on the electrode to a thickness of 0.3 to 10 μm.

As shown in FIG. 6, with the photosensitive member 1 and the electric charge retaining medium 2 disposed face-to-face with each other, image exposure is effected with a voltage being applied between the two electrodes, thereby forming an electrostatic charge pattern in the form of the image on the electric charge retaining medium, in the same way as in the case of FIG. 2.

Figure 7:
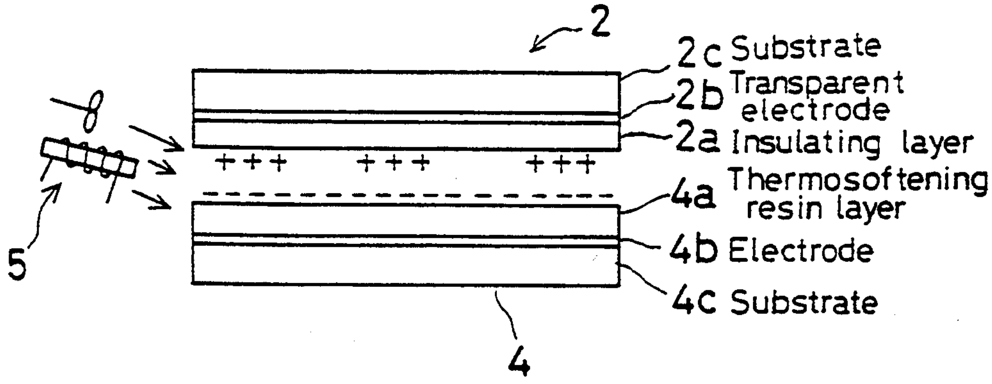
FIG. 7 is a view for explanation of thermal development.
Figure 8:
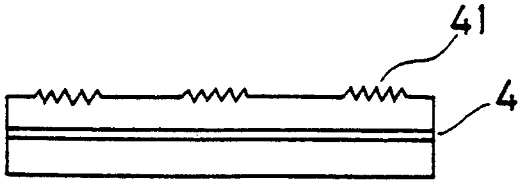
FIG. 8 is a view for explanation of a frost image formed.

Next, as shown in FIG. 7, the electric charge retaining medium 4, which is used as a reproductive electric charge retaining medium, is disposed in opposing relation to the electric charge retaining medium 2 formed with the electrostatic charge pattern, which is used as a master electric charge retaining medium, such that the thermosoftening resin layer 4a faces the insulating material layer 2a across an air gap of 0.5 to 10 μm. In this state, heating is carried out for several minutes at 60° C. for example, thereby softening the thermosoftening resin layer 4a. At this time, electric charge which is opposite in sign to the electric surface charge on the insulating material layer is induced on the thermosoftening resin layer 4a, so that Coulomb force acts between the electric charges. As a result, a dimple pattern image 41 is formed on the surface of the softened resin layer, as shown in FIG. 8. The dimple pattern is fixed by cooling and thus recorded as information. Since the heat distortion temperature of the thermosoftening resin layer is set lower than the softening point of the insulating material layer 2a, substantially no electrostatic charge on the insulating material layer 2a leaks and no deformation occurs either, and it is therefore possible to effect transfer any number of times by similarly effecting thermal development with another electric charge retaining medium 4 disposed face-to-face with the electric charge retaining medium 2.

If an electric charge retaining medium 4 which is to be subjected to transfer development is stored in advance with electric charge which is opposite in polarity to the electrostatic charge pattern, it is possible to increase the potential difference between the two electric charge retaining media 2 and 4 and hence increase the Coulomb force acting on the electric charge on the thermosoftening resin layer, thus making it possible to increase the depth of the dimple pattern image. In this case, the inverse charging may be effected uniformly or in the form of a pattern. In the case of the charging in the form of a pattern, the frost image can be modulated in the form of the pattern.

When light is applied to the electric charge retaining medium formed with the dimple pattern image in this way, irregular reflection occurs at the portions where the dimple patterns are formed, so that the information can be reproduced by reading whether a dimple pattern is present or not by use of the transmitted or reflected light.

For example, if light is applied to observe the transmitted light image, a portion where a frost image is formed causes irregular reflection and looks black, whereas a portion where no frost image is formed transmits the light and looks white, thus enabling observation of a positive image of the frost image. On the other hand, if light is applied to observe the reflected light image, a portion where a frost image is formed causes irregular reflection and looks white, whereas a portion where no frost image is formed transmits the light and shows the background color, thus enabling observation of a negative image of the frost image. It should be noted that the electric surface charge leaks in the heating process and the greater part of it disappears.

Examples of the method shown in FIGS. 6 and 7 will next be explained.

EXAMPLE 3

A 50 wt % solution, which was prepared by dissolving 20 g of a rosin ester polymer (Stebelite ester 10, trade name, manufactured by Rika Hercules Co.) in 20 g of monochlorobenzene, was coated on a glass substrate of 1 mm thick having an ITO electrode evaporated thereon by use of a spin coater at 2000 rpm and then dried for about 1 hour at 60° C. to obtain a thin film of 5 μm thick.

EXAMPLE 4

A 7 wt % fluorine solution (manufactured by Asahi Glass Company, Ltd.) of fluorocarbon resin (Cytop, trade name, manufactured by Asahi Glass Company, Ltd.) was coated on a glass substrate of 1 mm thick having an ITO electrode evaporated thereon by use of a spin coater at 1500 rpm and then dried for about 1 hour at 150° C. to obtain a thin Cytop film of 2.6 μm thick.

EXAMPLE 5

The medium obtained in Example 4 and an organic photoconductive material stacked on a transparent electrode were disposed face-to-face with each other across an air gap defined by a spacer comprising a polyester film of 9 μm. Next, image exposure was effected by projecting an image from the transparent electrode side of the photoconductive material under the application of 700 V for 0.1 sec between the two electrodes, thereby forming an electrostatic latent image on the medium. Thereafter, the medium formed with the electrostatic latent image was disposed face-to-face with the medium which was obtained in Example 3 and coronadischarged to 200 V across an air gap defined by a spacer comprising a polyester film of 3.5 μm. This was heated for 3 minutes in an oven at 60° C. Thus, it was possible to obtain a frost image on the medium obtained in Example 4.

INDUSTRIAL APPLICABILITY

According to the present invention, the lowering in the contrast of the master electric charge retaining medium can be prevented by making the electrostatic capacity of the master electric charge retaining medium adequately larger than the electrostatic capacity of the reproductive electric charge retaining medium, and transfer or reproduction can be effected any number of times without softening the insulating material layer having an electrostatic charge image formed thereon during the heating process. Thus, the present invention can contribute greatly to the application in various fields of electrostatic information recording.

What is claimed is:

1. An electrostatic charge information reproducing method comprising the steps of:

(a) providing a master electric charge retaining medium comprising an electrically conductive layer and an insulating layer having a first main face confronting the electrically conductive layer and also having a second main face;

(b) providing a reproductive electric charge retaining medium comprising an electrically conductive layer and an insulating layer, the insulating layer of the reproductive electric charge retaining medium having a first main face in face-to-face contact with the electrically conductive layer of the reproductive electric charge retaining medium and also having a second main face;

(c) charging the insulating layer of the master electric charge retaining medium with electrostatic charge information;

(d) disposing the reproductive electric charge retaining media so that the second main face of the insulating layer of the reproductive electric charge retaining medium is in face-to-face confronting relationship with the second main face of the insulating layer of the master electric charge retaining medium thereby forming a gap therebetween wherein an inherent electric field results across the gap at regions of said electrostatic charge information; and (e) applying a voltage between said conductive layers of said two electric charge retaining media for inducing an electric field in said gap;

wherein said voltage is applied with an amplitude for providing an electrostatic discharge between the master and the reproductive electric charge retaining media, whereby reproduced electrostatic charge information is produced on said reproductive electric image retaining medium in accordance with said electrostatic image information of the master electric charge retaining medium.

2. An electrostatic charge information reproducing method comprising the steps of:

(a) providing a master electric charge retaining medium comprising an electrically conductive layer and an insulating layer having a first main face confronting the electrically conductive layer and also having a second main face and a given electrostatic charge capacity;

(b) providing a reproductive electric charge retaining medium comprising an electrically conductive layer and an insulating layer, the insulating layer of the reproductive charge retaining medium having a first main face confronting the electrically conductive layer of the reproductive charge retaining medium and also having a second main face and an electrostatic charge capacity less than the given electrostatic charge capacity of the master electric charge retaining medium;

(c) charging the insulating layer of the master electric charge retaining medium with electrostatic charge information;

(d) disposing the reproductive electric charge retaining media so that the second main face of the insulating layer of the reproductive electric charge retaining medium is in face-to-face confronting relationship with the second main face of the insulating layer of the master electric charge retaining medium thereby forming a gap therebetween wherein an inherent electric field results across the gap at regions of said electrostatic charge information; and (e) applying a voltage between said conductive layers of said two electric charge retaining media for inducing an electric field in said gap;

wherein said voltage is applied with an amplitude for providing an electrostatic discharge between the master and the reproductive electric charge retaining media, whereby reproduced electrostatic charge information is produced on said reproductive electric image retaining medium in accordance with said electrostatic image information of the master electric charge retaining medium.

3. A method according to claim 1 further comprising repeating the steps (a), (d) and (e) a plurality of times for reproducing charge information upon a plurality of reproductive electric charge retaining media in accordance with said electrostatic charge information of the master electric charge retaining medium.

4. A method according to claim 2 wherein the first main face of the insulating layer of the reproductive electric charge retaining medium is in face-to-face contact with the electrically conductive layer thereof.

5. A method according to claim 2, further comprising repeating the steps (a), (d) and (e) a plurality of times for reproducing charge information upon a plurality of reproductive electric charge retaining media in accordance with said electrostatic charge information of the master electric charge retaining medium.

* * * * *